(12) United States Patent
Kim

(10) Patent No.: US 9,264,034 B2
(45) Date of Patent: Feb. 16, 2016

(54) CIRCUIT AND METHOD FOR BODY BIASING

(71) Applicant: NXP B.V., Eindhoven (NL)

(72) Inventor: Jong Koo Kim, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/328,472

(22) Filed: Jul. 10, 2014

(65) Prior Publication Data

US 2015/0180469 A1 Jun. 25, 2015

Related U.S. Application Data

(63) Continuation-in-part of application No. 14/256,799, filed on Apr. 18, 2014.

(60) Provisional application No. 61/918,529, filed on Dec. 19, 2013.

(51) Int. Cl.
*H01L 29/66* (2006.01)
*H03K 17/687* (2006.01)

(52) U.S. Cl.
CPC .................................. *H03K 17/687* (2013.01)

(58) Field of Classification Search
USPC .......................... 257/335, E27.015, E27.017, 257/E27.03–E27.032, E27.109, 257/E29.194–E29.225; 365/185.27; 327/534, 537
See application file for complete search history.

(56) References Cited

U.S. PATENT DOCUMENTS

| | | | |
|---|---|---|---|
| 6,281,742 B1 | 8/2001 | Sung | |
| 7,446,598 B2 | 11/2008 | Pertijs et al. | |
| 2002/0000868 A1 | 1/2002 | Jeong | |
| 2007/0165474 A1 | 7/2007 | Kim et al. | |
| 2009/0219086 A1* | 9/2009 | Iida | H03F 3/005 330/4.9 |
| 2010/0289564 A1 | 11/2010 | Wang | |
| 2011/0221519 A1* | 9/2011 | Katoh | H04B 1/0057 327/558 |
| 2011/0285481 A1* | 11/2011 | Huang | H01P 1/22 333/81 R |
| 2012/0146705 A1 | 6/2012 | Den Besten | |
| 2013/0321067 A1 | 12/2013 | Kim | |
| 2014/0266411 A1* | 9/2014 | Honda | H03K 17/063 327/537 |

* cited by examiner

*Primary Examiner* — Dao H Nguyen
*Assistant Examiner* — Tram H Nguyen

(57) ABSTRACT

Various example embodiments are directed to methods and circuits for mitigation of on-resistance variation and signal attenuation in transistors due to body effects. In some embodiments, an apparatus includes a transistor configured to provide a data signal from a first one of the source or the drain to the other one of the source or the drain in response to a control signal provided to the gate. A body bias circuit is configured to bias the body of the transistor based on a voltage of the data signal to reduce variation in the on-resistance exhibited by the first transistor. In an embodiment, the apparatus includes body bias transistors and switches and the gates of the body bias transistors are connected to protect the body bias transistors from the effects of electrostatic discharge (ESD) events.

19 Claims, 3 Drawing Sheets

CIRCUIT AND METHOD FOR BODY BIASING

The current application is a Continuation in Part of U.S. non-Provisional patent application Ser. No. 14/256,799, filed on Apr. 18, 2014, which claims benefit under 35 U.S.C. §119 to U.S. Provisional Patent Application Ser. No. 61/918,529, entitled "MOS Body Effect Compensation for a High-Speed MOS Switch," filed on Dec. 19, 2013, both of which are fully incorporated herein by reference.

Various aspects of the disclosure are directed to switching circuits, and more particularly to transistor based switching circuits. Transistors are used in various circuits and devices to provide a switchable path between a source and a drain of the transistor for communication of a data signal. The threshold voltage at which a transistor switches from an off (high resistance) state to an on (low resistance) state is a function of its source-bulk voltage, which is referred to as the body effect. Due to the body effect, resistance of the transistor in the on state (referred to as on-resistance) may vary for different voltages of a data signal communicated between the source and the drain of the transistor. The communicated data signal may be attenuated as a result of the variation of the on-resistance.

Various example embodiments are directed to methods and circuits for mitigation of on-resistance variation and signal attenuation in transistors, due to body effects. In some embodiments, an apparatus includes a transistor having a source, a drain, a gate, and a body. The transistor is configured to provide a data signal from a first one of the source or the drain to the other one of the source or the drain, in response to a control signal provided to the gate. A body bias circuit is configured to bias the body of the transistor, based on a voltage of the data signal and to reduce attenuation of the data signal. In an embodiment, the apparatus includes body bias transistors and switches and the gates of the body bias transistors are connected to protect the body bias transistors from the effects of electrostatic discharge (ESD) events.

In an embodiment, a first switch is connected between a second transistor and a first one of the source or the drain of a first transistor, a second switch is connected between a third transistor and the other one of the source or the drain of the first transistor. Further, the gate of the second transistor is connected between the second switch and the third transistor and the gate of the third transistor is connected between the first switch and the second transistor In some embodiments, methods are provided for data switching. Using a transistor, a data signal is communicated between a source of the transistor and a drain of the transistor, in response to a control signal. Based on a voltage of the data signal, a body of the transistor is biased to reduce attenuation of the data signal by the transistor. The method may also involve disconnecting the gate of a body bias transistor from one of the source or the drain of the transistor by opening a switch, wherein the gate of the body bias transistor is connected between one of the source or drain of the transistor and one of the source or drain of the body bias transistor.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
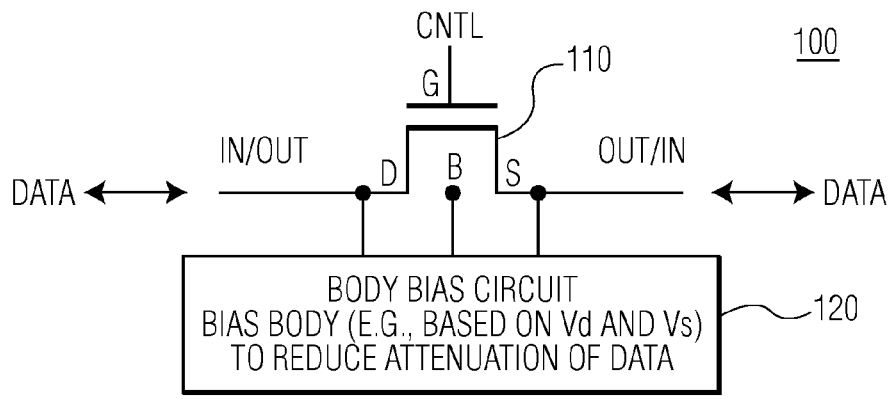
FIG. 1 shows a first switching circuit with body biasing circuitry, in accordance with one or more embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving transistors switching circuits. While not necessarily so limited, various aspects may be appreciated through a discussion of examples using this context.

Various example embodiments are directed to methods and circuits for mitigation of on-resistance variation and signal attenuation in transistors due to body effects. In some embodiments, an apparatus includes a transistor having a source, a drain, a gate, and a body. The transistor is configured to provide a data signal from a first one of the source or the drain to the other one of the source or the drain, in response to a control signal provided to the gate. As described above, the transistor is subject to variation in the on-resistance caused by body effects. As a result of the variation in the on-resistance, the data signal may be attenuated by the transistor. A body bias circuit is configured to bias the body of the transistor, based on a voltage of the data signal, to reduce variation in the on-resistance exhibited by the first transistor. As a result of the reduced variation in the on-resistance, attenuation of the data signal is reduced.

Various embodiments may bias the body of either n-type or p-type transistors differently. In some implementations, a body bias circuit is configured to bias the body of an n-type transistor by biasing the transistor toward the lesser of a source voltage of the source and a drain voltage of the drain. In some other implementations, a body bias circuit is configured to bias the body of a p-type transistor by biasing the transistor toward the greater of a source voltage of the source and a drain voltage of the drain.

In some implementations, the body bias circuit includes first and second switching circuits. For biasing of an n-type transistor, the first switching circuit is configured to connect the body of the transistor to the drain of the transistor, in response to the drain voltage being less than the source voltage. The second switching circuit is configured to connect the body of the transistor to the source of the transistor, in response to the drain voltage being greater than the source voltage.

Conversely, for biasing of an n-type transistor, the first switching circuit is configured to connect the body of the transistor to the drain of the transistor, in response to the drain voltage being greater than the source voltage. The second switching circuit is configured to connect the body of transistor to the source of the transistor, in response to the drain voltage being less than the source voltage.

In some embodiments, the body bias circuit is configured and arranged to bias the body of the first transistor to follow a voltage of the input data signal. For instance, the body bias circuit may increase the voltage applied to the body, in response to an increase in the voltage of the input data signal, and decrease the voltage applied to the body, in response to a decrease in the voltage of the input data signal.

Methods for data switching are also disclosed. Using a transistor, a data signal is communicated between a source of the transistor and a drain of the transistor, in response to a control signal. Based on a voltage of the data signal, a body of the transistor is biased to reduce attenuation of the data signal by the transistor. If the transistor is an n-type transistor, the body is biased toward the lesser of a source voltage of the source or a drain voltage of the drain. If the transistor is a p-type transistor, the body is biased toward the greater of the source voltage or the drain voltage. The body may be biased toward the source voltage or drain voltage, for example, by connecting the body to the source or to the drain, respectively.

As indicated above, the embodiments may be used for biasing either n-type or p-type transistors. While embodiments are not so limited, for ease of explanation, the examples are primarily illustrated and described with reference to n-type transistors.

Turning now to the figures, FIG. 1 shows a switching circuit with body biasing circuitry, in accordance with one or more embodiments of the present disclosure. The switching circuit 100 includes a transistor 110 having a source (S), a drain (D), a gate (G), and a body (B). The transistor 110 is configured to provide a data signal (Data) from a first one of the source or the drain to the other one of the source or the drain, in response to a control signal (Cntl) provided to the gate. As described above, the transistor 110 is subject to variation in the on-resistance caused by body effects. As a result of the variation in the on-resistance, the data signal (Data) may be attenuated by the transistor. A body bias circuit 120 is configured to bias the body of the transistor, based on a drain voltage (Vd) of the drain and a source voltage (Vs) of the source in order to reduce variation in the on-resistance exhibited by the transistor 110. As a result of the reduced variation in the on resistance, attenuation of the data signal (Data) is reduced.

Figure 2:
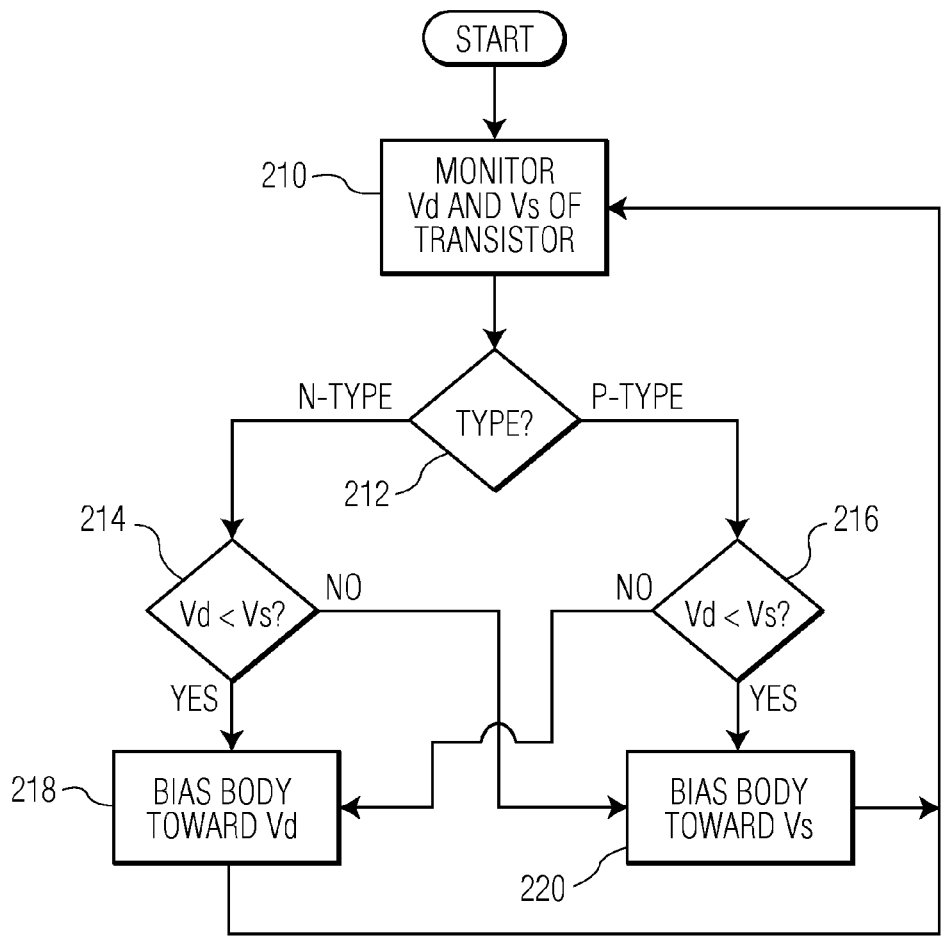
FIG. 2 shows a process for biasing a body to reduce signal attenuation, in accordance with one or more embodiments of the present disclosure.

FIG. 2 shows a process for biasing a body to reduce signal attenuation, in accordance with one or more embodiments of the present disclosure. The process may be implemented, for example, by the body biasing circuit shown in FIG. 1. At block 210 the source voltage and the drain voltage of a transistor are monitored. The process biases p-type transistors and n-type transistors differently. For an n-type transistor, decision block 212 directs the process to decision block 214. If the drain voltage Vd is less than the source voltage Vs, decision block 214 directs the process to bias the body toward the drain voltage at block 218. If the drain voltage Vd is not less than the source voltage Vs, decision block 214 directs the process to bias the body toward the source voltage at block 220.

For a p-type transistor, decision block 212 directs the process to decision block 216. If the drain voltage Vd is less than the source voltage Vs, decision block 216 directs the process to bias the body toward the source voltage at block 220. If the drain voltage Vd is not less than the source voltage Vs, decision block 216 directs the process to bias the body toward the drain voltage at block 218. After biasing the body at blocks 218 or 220, the process returns to block 210 and is repeated. The process may be repeated continuously.

By biasing the body toward the lesser of the source and drain voltage for n-type transistors and toward the greater of the source and drain voltages for p-type transistors, variation in on-resistance is reduced. Simulation of an implementation, which biases as NMOS transistor passing a 0V-2V data signal, reduces on-resistance variation from approximately 0.8 ohm variation to 0.3 ohm variation.

In this example, the process is configured for biasing either p-type or n-type transistors. In some implementations, the process may be configured to bias only a single type of transistor (either p-type or n-type).

Figure 3:
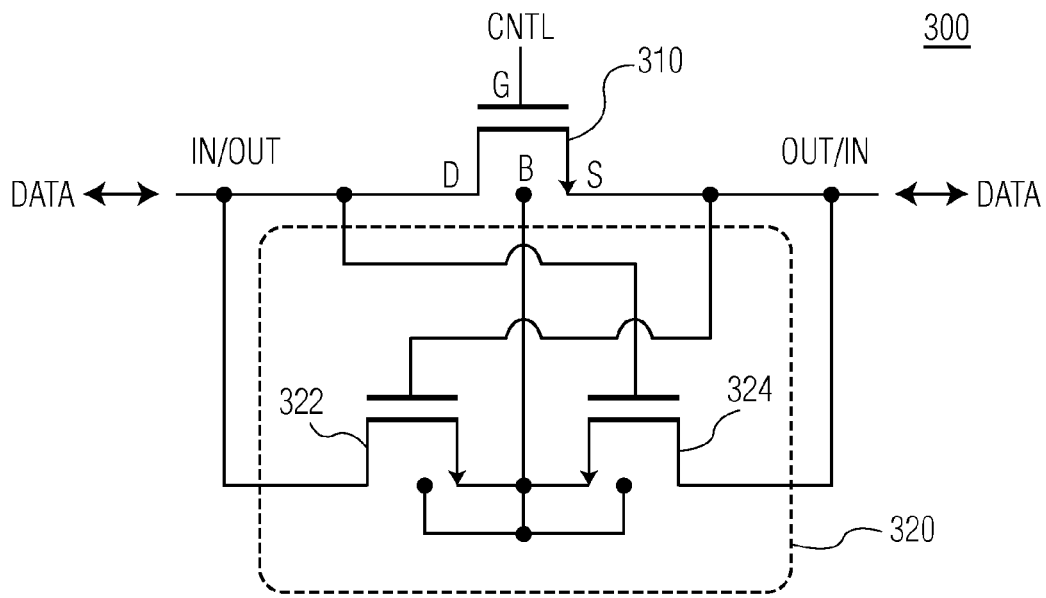
FIG. 3 shows a second switching circuit with body biasing circuitry, in accordance with one or more embodiments of the present disclosure.

FIG. 3 shows another switching circuit with body biasing circuitry, in accordance with one or more embodiments of the present disclosure. The switching circuit 300 includes a transistor 310 having a source (S), a drain (D), a gate (G), and a body (B). The transistor 310 is configured to provide a data signal (Data) from a first one of the source or the drain to the other one of the source or the drain, in response to a control signal (Cntl) provided to the gate. The transistor 310 is subject to variation in the on-resistance caused by body effects. As a result of the variation in the on-resistance, the data signal (Data) may be attenuated by the transistor. A body bias circuit 320 is configured to bias the body of the transistor, based on a drain voltage (Vd) of the drain and a source voltage (Vs) of the source to reduce variation in the on-resistance exhibited by the transistor 310. In this example, the transistor 310 is an NMOS transistor. The body bias circuit 320 is configured to bias the body toward the lesser of a source voltage or the drain voltage.

In this example, the body bias circuit 320 includes a first transistor 322 configured to connect the body of transistor 310 to the drain of transistor 310, in response to the drain voltage being less than the source voltage. The body bias circuit 320 also includes a second transistor 324 configured to connect the body of transistor 310 to the source of transistor 310, in response to the source voltage being less than the drain voltage. As a result, the body bias circuit 320 pulls the body of transistor 310 toward the lesser of the source and drain voltages.

In this example, the body is not fully charged/discharged to either drain or source voltages as a result of the biasing. Rather, the transistors 322 and 324, also referred to as "body bias transistors," disconnect the body from the source or drain once the voltage of the body and the voltage of the source/drain differ by a voltage less than the threshold switching voltage of the transistors 322 and 324. This maintains a positive (negative for PMOS) voltage from the drain/source to the body and helps prevent parasitic effects such as latch-up, drain-source direct leakage, etc.

Figure 4:
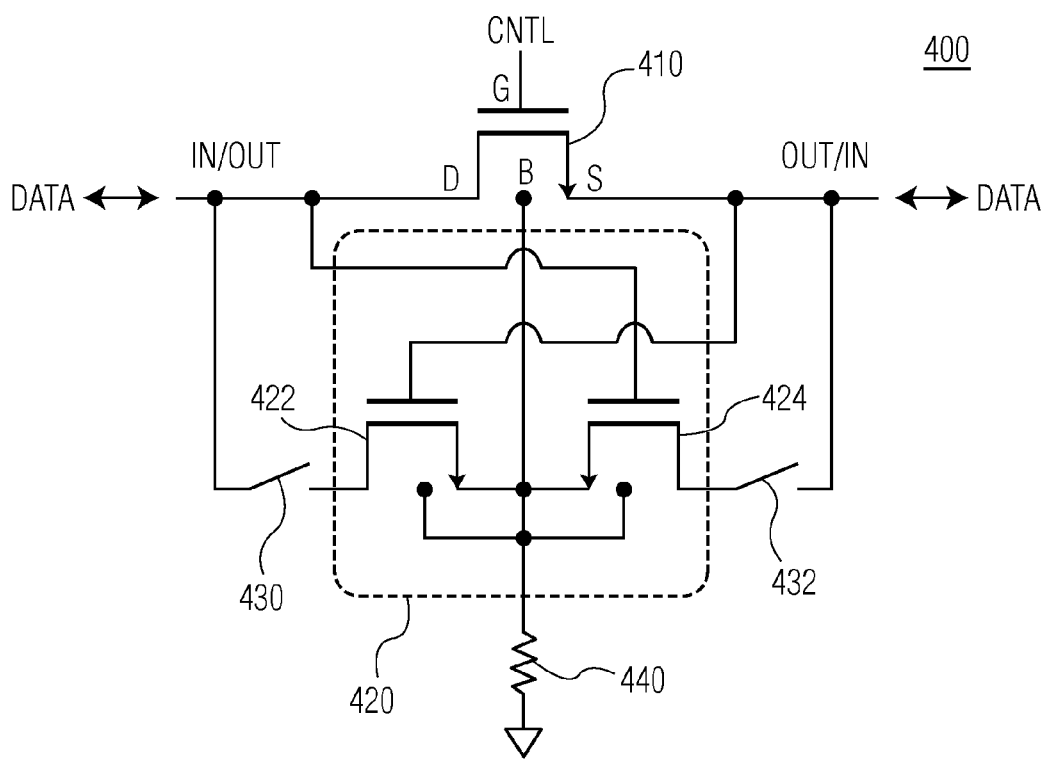
FIG. 4 shows a third switching circuit with body biasing circuitry, in accordance with one or more embodiments of the present disclosure.

FIG. 4 shows a third switching circuit with body biasing circuitry, in accordance with one or more embodiments of the present disclosure. The switching circuit 400 includes a transistor 410 and a body bias circuit 420 with transistors 422 and 424, which are configured and arranged as described with reference to elements 310, 320, 322, and 324 in the switching circuit shown in FIG. 3. In this example, the switching circuit further includes a kilo-ohm range resistor 440 configured to discharge the isolated well potential to the ground, which may further mitigate parasitic effects in the switching circuits. In some implementations, the switching circuit 400 may also include switches 430 and 432 to connect/disconnect source/drain terminals of transistors 422 and 424 from the source and drain terminals of the transistor 410. By disconnecting the source/drain terminals of transistors 422 and 424 from the source and drain terminals of the transistor 410, the body bias circuit 420 is disabled. In some embodiments, the body bias circuit 420 may be enabled/disabled by a user control or by a control circuit. In an embodiment, the switches 430 and 432 are controlled by gate voltages that are much higher than the gate voltages that are used to control transistors 422 and 424. For example, the gate voltage of the switches 430 and 432 may be in the range of Xv-Yv and the gate voltage of the transistors 422 and 424 may be in the range of 0v-4v. Therefore, the switches 430 and 432 can be MOS transistors with a much higher brake down voltage than the transistors 422 and 424, e.g., on the order of two times higher than transistors 422 and 424.

In an embodiment, a switching circuit can be susceptible to an electrostatic discharge (ESD) event, which may cause the circuit to fail certain ESD specifications. For example, with reference to FIG. 4, when the transistors 422 and 424 are directly connected to external input/output pads, the transistors 422 and 424 are susceptible to ESD events. In an embodiment, the gates of the body bias transistors 422 and 424 are "hidden" from the external input/output pads by connecting the gates of the body bias transistors after the switches 430 and 432 to protect the body bias transistors from the effects of an ESD event.

Figure 5:
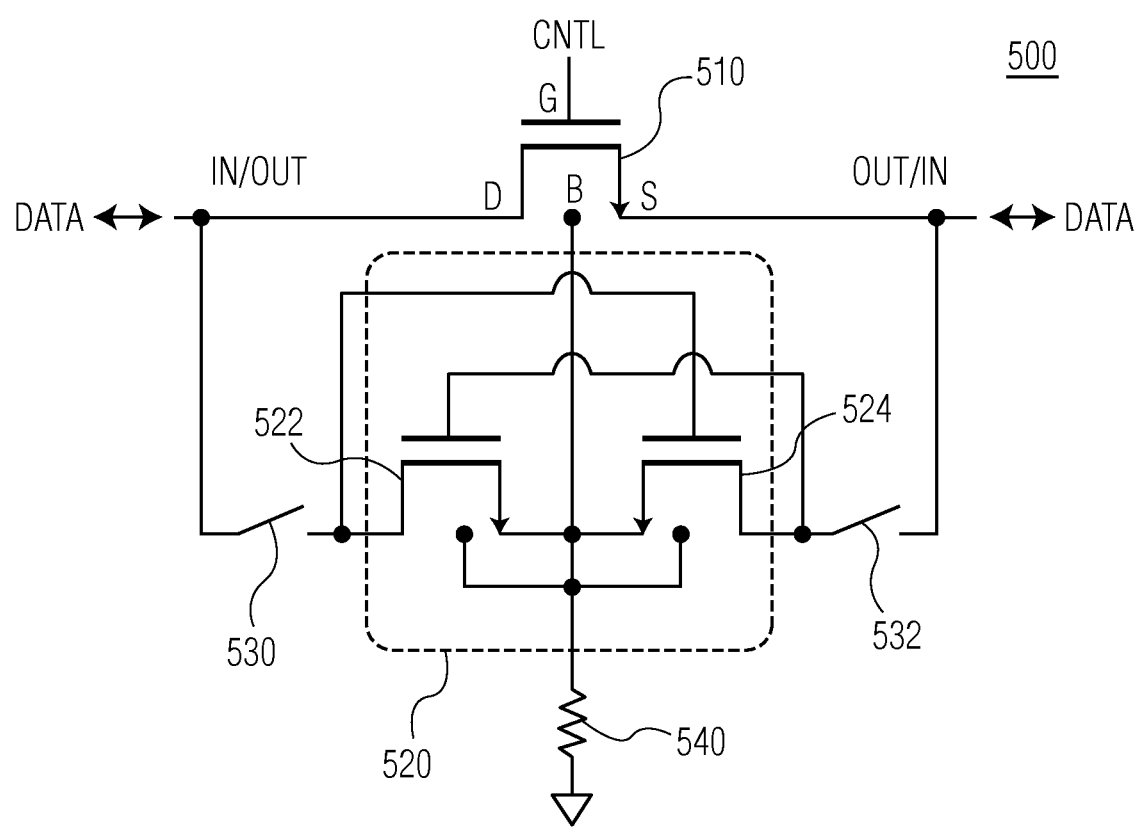
FIG. 5 shows a fourth switching circuit with body biasing circuitry, in accordance with one or more embodiments of the present disclosure.

FIG. 5 shows a fourth switching circuit with body biasing circuitry, in accordance with one or more embodiments of the present disclosure, in which the gates of the body bias transistors are connected after the switches to protect the body bias transistors from the effects of an ESD event. The switching circuit 500 includes a transistor 510 and a body bias circuit 520 with transistors 522 and 524, which are configured and arranged as described with reference to elements 410, 420, 422, and 424 in the switching circuit shown in FIG. 4. In the embodiment of FIG. 5, the gates of the transistors 522 and 524 are connected between the switch and the source/drain of the opposing transistor. For example, the gate of transistor 522 is connected between the drain of transistor 524 and the switch 532 and the gate of transistor 524 is connected between the drain of transistor 522 and the switch 530. In the embodiment of FIG. 5, the switches 530 and 532 connect/disconnect source/drain terminals of transistors 522 and 524 from the source and drain terminals of the transistor 510. By disconnecting the source/drain terminals of transistors 522 and 524 from the source and drain terminals of the transistor 510, the body bias circuit 520 is disabled. In some embodiments, the body bias circuit 520 may be enabled/disabled by a user control or by a control circuit.

The disclosed embodiments may be applicable to a variety of applications using transistor switching circuits including, but not limited to, switches, transmitters, input/output circuits, and/or line drivers configured for high speed communications. High speed applications may communicate data using various communication protocols including, but not limited to, DDR, SATA, DisplayPort, PCIe, USB, MIPI, HDMI, V-by-One, and Ethernet.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., biasing of voltages). For example, in certain of the above-discussed embodiments, one or more modules are discrete logic circuits or programmable logic circuits configured and arranged for implementing these operations/activities, as in the circuit modules shown in the figures. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, though aspects and features may in some cases be described in individual figures, it will be appreciated that features from one figure can be combined with features of another figure even though the combination is not explicitly shown or explicitly described as a combination. Such modifications do not depart from the true spirit and scope of various aspects of the invention, including aspects set forth in the claims.

What is claimed is:

1. An apparatus, comprising:
a first transistor having a source, a drain, a gate, and a body, the first transistor configured and arranged to provide a data signal from a first one of the source or the drain to the other one of the source or the drain in response to a control signal provided to the gate, the first transistor being subject to attenuation of the data signal due to body effects; and
a body bias circuit configured and arranged to bias the body of the first transistor based on a voltage of the data signal and to reduce attenuation of the data signal by the first transistor, wherein the body bias circuit includes:
a second transistor having a source, a drain, and a gate and wherein the source and drain are connected between the body of the first transistor and the first one of the source or the drain of the first transistor;
a third transistor having a source, a drain, and a gate and wherein the source and drain are connected between the body of the first transistor and the other one of the source or drain of the first transistor;
the apparatus further including:
a first switch connected between the second transistor and the first one of the source or the drain of the first transistor;
a second switch connected between the third transistor and the other one of the source or the drain of the first transistor;
wherein the gate of the second transistor is connected between the second switch and the third transistor and the gate of the third transistor is connected between the first switch and the second transistor.

2. The apparatus of claim 1, wherein:
the first transistor is an n-type transistor subject to variation in on-resistance between the source and drain for different voltages of the data signal due to body effects; and
the body bias circuit is configured and arranged to bias the body of the first transistor toward the lesser of a source voltage of the source and a drain voltage of the drain, thereby reducing variation in the on-resistance exhibited by the first transistor.

3. The apparatus of claim 2, wherein:
the body bias circuit is configured and arranged to
in response to the drain voltage being less than the source voltage, bias the body of the first transistor toward the drain voltage of the drain; and
in response to the source voltage being less than the drain voltage, bias the body of the first transistor toward the source voltage.

4. The apparatus of claim 2, wherein:
the second transistor is configured and arranged to connect the body of the first transistor to the drain of the first transistor in response to the drain voltage being less than the source voltage; and
the third transistor is configured and arranged to connect the body of the first transistor to the source of the first transistor in response to the drain voltage being greater than the source voltage.

5. The apparatus of claim 1, wherein:
the first transistor is a p-type transistor subject to variation in on-resistance between the source and drain for different voltages of the data signal due to body effects; and
the body bias circuit is configured and arranged to bias the body of the first transistor toward the greater of a source voltage of the source and a drain voltage of the drain, thereby reducing variation in the on-resistance exhibited by the first transistor.

6. The apparatus of claim 5, wherein:
the body bias circuit is configured and arranged to
in response to drain voltage being greater than the source voltage, bias the body of the first transistor toward the drain voltage; and
in response to the source voltage being greater than the drain voltage, bias the body of the first transistor toward the source voltage.

7. The apparatus of claim 6, wherein:
the second transistor is configured and arranged to connect the body of the first transistor to the drain of the first transistor in response to the drain voltage being greater than the source voltage; and
the third transistor is configured and arranged to connect the body of the first transistor to the source of the first transistor in response to the drain voltage being less than the source voltage.

8. The apparatus of claim 1, wherein the body bias circuit is configured and arranged to bias the body of the first transistor to follow a voltage of the data signal.

9. An apparatus, comprising:
a first transistor having a source, a drain, a gate, and a body, wherein the transistor is subject to variation in on-resistance between the source and drain for different voltages of an input data signal due to body effects; and
a body bias circuit configured and arranged to bias the body of the first transistor to reduce variation in the on-resistance exhibited by the first transistor, thereby reducing attenuation of the input data signal;
the body bias circuit including:
a second transistor having a source, a drain, and a gate and wherein the source and drain are connected between the body of the first transistor and the first one of the source or the drain of the first transistor;
a third transistor having a source, a drain, and a gate and wherein the source and drain are connected between the body of the first transistor and the other one of the source or drain of the first transistor;

the apparatus further including:
a first switch connected between the second transistor and the first one of the source or the drain of the first transistor;
a second switch connected between the third transistor and the other one of the source or the drain of the first transistor;
wherein the gate of the second transistor is connected between the second switch and the third transistor and the gate of the third transistor is connected between the first switch and the second transistor.

10. The apparatus of claim 9, further comprising
a switch including the first transistor and having an input/output node connected to the drain, an output/input node connected to the source, and a control node connected to the gate, the switch being configured and arranged to communicate the input data signal between the input/output node and the output/input node in response to the control node exceeding a threshold voltage; and
wherein the body bias circuit is configured to bias the body of the first transistor to follow the input data signal.

11. The apparatus of claim 9, wherein:
the first transistor is an n-type transistor; and
the body bias circuit is configured and arranged to bias the body of the first transistor toward the lesser of a source voltage of the source and a drain voltage of the drain.

12. The apparatus of claim 9, wherein:
the first transistor is an n-type transistor; and
the second transistor is configured and arranged to connect the body of the first transistor to the drain of the first transistor in response to the drain voltage being less than the source voltage, and
the third transistor is configured and arranged to connect the body of the first transistor to the source of the first transistor in response to the drain voltage being greater than the source voltage of the source.

13. The apparatus of claim 9, wherein:
the first transistor is a p-type transistor; and
the second transistor is configured and arranged to connect the body of the first transistor to the drain of the first transistor in response to the drain voltage being greater than the source voltage, and
the third transistor is configured and arranged to connect the body of the first transistor to the source of the first transistor in response to the drain voltage being less than the source voltage of the source.

14. A method, comprising:
communicating a data signal between a source of a transistor and a drain of the transistor in response to a control signal, the transistor being subject to attenuation of the data signal due to body effects;
biasing, based on a voltage of the data signal, a body of the transistor to reduce attenuation of the data signal by the transistor; and
disconnecting the gate of a body bias transistor from one of the source or the drain of the transistor by opening a switch, wherein the gate of the body bias transistor is connected between one of the source or drain of the transistor and one of the source or drain of the body bias transistor.

15. The method of claim 14, wherein:
the transistor is an n-type transistor; and
the biasing the body includes biasing the body toward the lesser of a source voltage of the source and a drain voltage of the drain.

16. The method of claim 15, wherein the biasing the body includes:

in response to the drain voltage being less than the source voltage, biasing the body of the transistor toward the drain voltage of the drain; and in response to the source voltage being less than the drain voltage, biasing the body of the transistor toward the source voltage.

17. The method of claim 16, wherein:

the biasing the body of the transistor toward the drain voltage of the drain includes connecting the body to the drain; and the biasing the body of the transistor toward the drain voltage of the drain includes connecting the body to the source.

18. The method of claim 14, wherein:

the transistor is a p-type transistor; and in response to a drain voltage of the drain being greater than a source voltage of the source, biasing the body of the transistor toward the drain voltage of the drain; and in response to the source voltage being greater than the drain voltage, biasing the body of the transistor toward the source voltage.

19. An apparatus, comprising:

a first transistor having a source, a drain, a gate, and a body, the first transistor configured and arranged to provide a data signal from an input to an output in response to a control signal provided to the gate, the first transistor being subject to attenuation of the data signal due to body effects;

a body bias circuit configured and arranged to bias the body of the first transistor based on a voltage of the data signal and to reduce attenuation of the data signal by the first transistor, wherein the body bias circuit includes:

a first body bias transistor having a source, a drain, and a gate and wherein the source and drain are connected between the body of the first transistor and input of the first transistor;

a second body bias transistor having a source, a drain, and a gate and wherein the source and drain are connected between the body of the first transistor and the output of the first transistor;

the apparatus further including:

a first switch connected between the first body bias transistor and the input of the first transistor;

a second switch connected between the second body bias transistor and the output of the first transistor;

wherein the gate of the first body bias transistor is connected between the second switch and the second body bias transistor and the gate of the second body bias transistor is connected between the first switch and the first body bias transistor.

* * * * *